United States Patent [19]

Wollesen

[11] Patent Number: 5,015,595
[45] Date of Patent: May 14, 1991

[54] METHOD OF MAKING A HIGH PERFORMANCE MOS DEVICE HAVING BOTH P- AND N- LDD REGIONS USING SINGLE PHOTORESIST MASK

[75] Inventor: Donald L. Wollesen, Saratoga, Calif.

[73] Assignee: Advanced Micro Devices, Inc., Sunnyvale, Calif.

[21] Appl. No.: 242,144

[22] Filed: Sep. 9, 1988

[51] Int. Cl.⁵ .......................................... H01L 21/265
[52] U.S. Cl. ...................................... 437/31; 437/41; 437/44; 437/57
[58] Field of Search ..................... 437/27, 28, 29, 30, 437/34, 40, 41, 44, 56, 57, 186, 238, 241, 228; 357/23.3, 23.4

[56] References Cited

U.S. PATENT DOCUMENTS

| | | |
|---|---|---|
| 3,996,657 | 12/1976 | Simko et al. |
| 3,997,367 | 12/1976 | Yau . |
| 4,109,371 | 8/1978 | Shibata et al. |
| 4,160,683 | 7/1979 | Roche . |
| 4,198,250 | 4/1980 | Jecmen . |
| 4,204,894 | 5/1980 | Komeda et al. |
| 4,209,349 | 6/1980 | Ho et al. |
| 4,209,350 | 6/1980 | Ho et al. |
| 4,234,362 | 11/1980 | Riseman . |
| 4,256,514 | 3/1981 | Pogge . |
| 4,354,896 | 10/1982 | Hunter et al. |
| 4,356,623 | 11/1982 | Hunter . |
| 4,366,613 | 1/1983 | Ogura et al. |
| 4,516,316 | 5/1985 | Haskell . |
| 4,577,391 | 3/1986 | Hsia et al. ........................... 437/44 |
| 4,590,663 | 5/1986 | Haken ................................. 437/34 |
| 4,728,617 | 3/1988 | Woo et al. |
| 4,729,001 | 3/1988 | Haskell . |
| 4,753,898 | 6/1988 | Parrillo et al. ...................... 437/34 |
| 4,764,477 | 8/1988 | Chang et al. ....................... 437/34 |
| 4,771,014 | 9/1988 | Liou et al. ........................... 437/44 |
| 4,818,714 | 4/1989 | Haskell ............................... 437/44 |
| 4,843,023 | 6/1989 | Chiu et al. ........................... 437/44 |

FOREIGN PATENT DOCUMENTS 0218408 4/1987 European Pat. Off. .
60-241267 11/1985 Japan .

OTHER PUBLICATIONS

Barnes, John J. et al, "Short-Channel MOSFET's in the Punchthrough Current Mode", *IEEE Transactions on Electron Devices*, vol. ED-26, No. 4, Apr. 1979, pp. 446-453.

Bassous, E. et al., "Self-Aligned Polysilicon Gate MOSFET's With Tailored Source and Drain Profiles", *IBM Technical Disclosure Bulletin*, vol. 22, No. 11, Apr. 1980, pp. 5146-5147.

Dennard, Robert H. et al, "Design of Ion-Implanted MOSFET's with Very Small Physical Dimensions", *IEEE Journal of Solid-State Circuits*, vol. SC-9, No. 5, Oct. 1974, pp. 256-268.

(List continued on next page.)

Primary Examiner—Olik Chaudhuri
Assistant Examiner—M. Wilczewski
Attorney, Agent, or Firm—John P. Taylor

[57] ABSTRACT

A method for making an integrated circuit structure having both PMOS and NMOS devices with lightly doped (LDD) source and drain regions is disclosed utilizing a single photoresist mask in which a substrate is implanted with a low concentration dopant of a first conductivity type through a silicon nitride shielding layer. Spacers are then formed against the sidewalls of oxide and nitride coated polysilicon gate electrodes by RIE etching of a polysilicon layer formed over the nitride shielding layer subsequent to the first implantation. A separate photoresist mask layer is then formed over a portion of the structure and the remaining exposed portions of the shielding nitride layer are then etched, resulting in the formation of first el-shaped shielding members against the sides of the gate electrodes. The exposed polysilicon spacers are then removed and the substrate is implanted with a high concentration dopant of a second conductivity type at an energy level insufficient to penetrate through the el-shaped nitride spacer to form conventional source/-drain regions in the substrate.

19 Claims, 7 Drawing Sheets

OTHER PUBLICATIONS

Gaensslen, F. H., "Geometry Effects of Small MOSFET Devices", *IBM Journal of Research and Development*, vol. 23, No. 6, Nov. 1979, pp. 682–688.

Ghandhi, Sorab K., *VLSI Fabrication Principles: Silicon and Gallium Arsenide*, New York: John Wiley & Sons, 1983, pp. 424–427.

Ogura, Seiki, et al, "Design and Characteristics of the Lightly Doped Drain-Source (LDD) Insulated Gate Field-Effect Transistor", *IEEE Transactions on Electron Devices*, vol. ED-27, No. 8, Aug. 1980, pp. 1359–1367.

Ohta, Kuniichi et al, "A Quadruply Self-Aligned MOS (QSA MOS) A New Short Channel High Speed High Density MOSFET for VLSI", *IEDM*, 1979, pp. 581–584.

Parrillo, L. C. et al; "A Versatile, High-Performance, Double-Level-Poly Double-Level-Metal, 1.2-Micron CMOS Technology", *IEDM*, 1986, pp. 244–247.

Pfiester, James R., "LDD MOSFET's Using Disposable Sidewall Spacer Technology", *IEEE Electron Device Letters*, vol. 9, No. 4, Apr. 1988, pp. 189–192.

Troutman, Ronald R., "VLSI Limitations from Drain-Induced Barrier Lowering", *IEEE Transactions on Electron Devices*, vol. ED-26, No. 4, Apr. 1979, pp. 461–469.

Tsang, Paul J. et al, "Fabrication of High-Performance LDDFET's With Oxide Sidewall-Spacer Technology", *IEEE Transactions on Electron Devices*, vol. ED-29, No. 4, Apr. 1982, pp. 590–596.

Wang, Paul P., "Double Boron Implant Short-Channel MOSFET", *IEEE Transactions on Electron Devices*, vol. ED-24, No. 3, pp. 196–204.

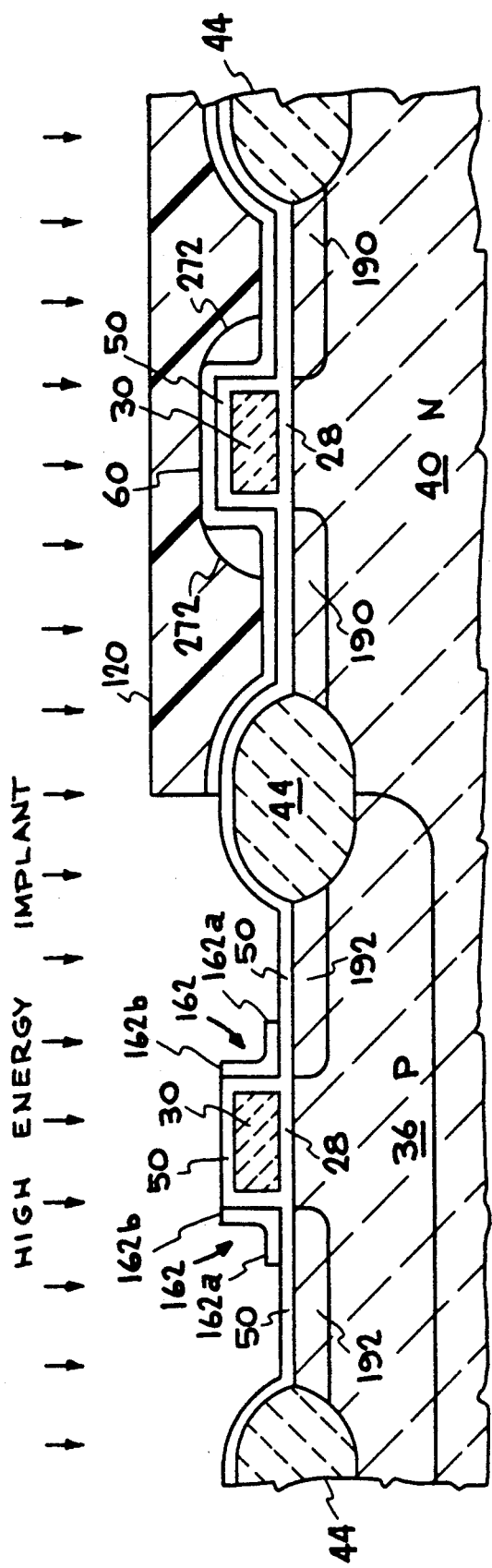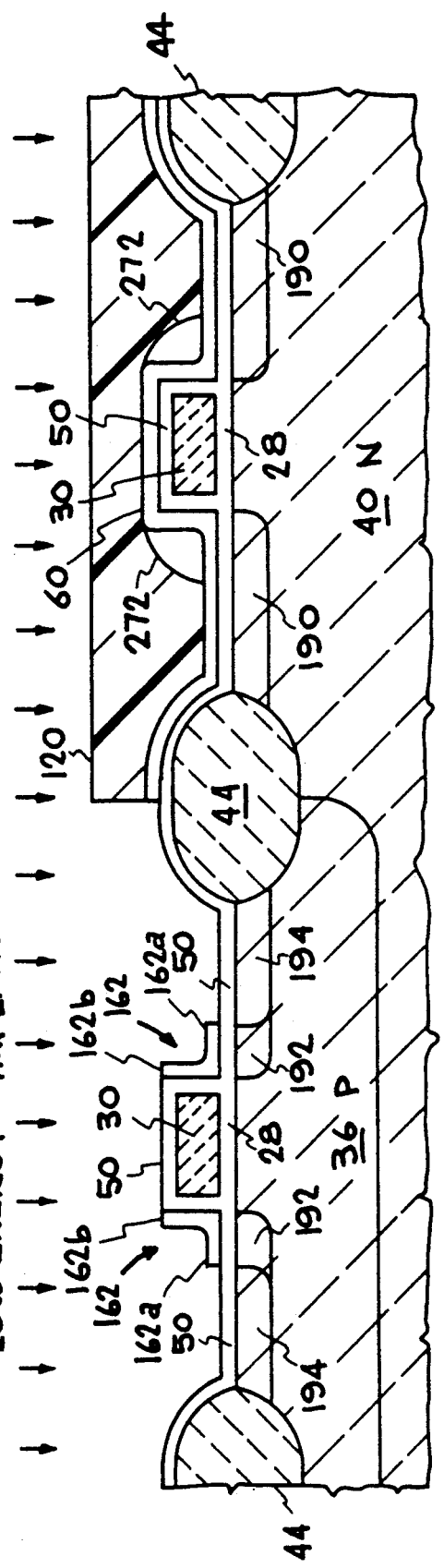

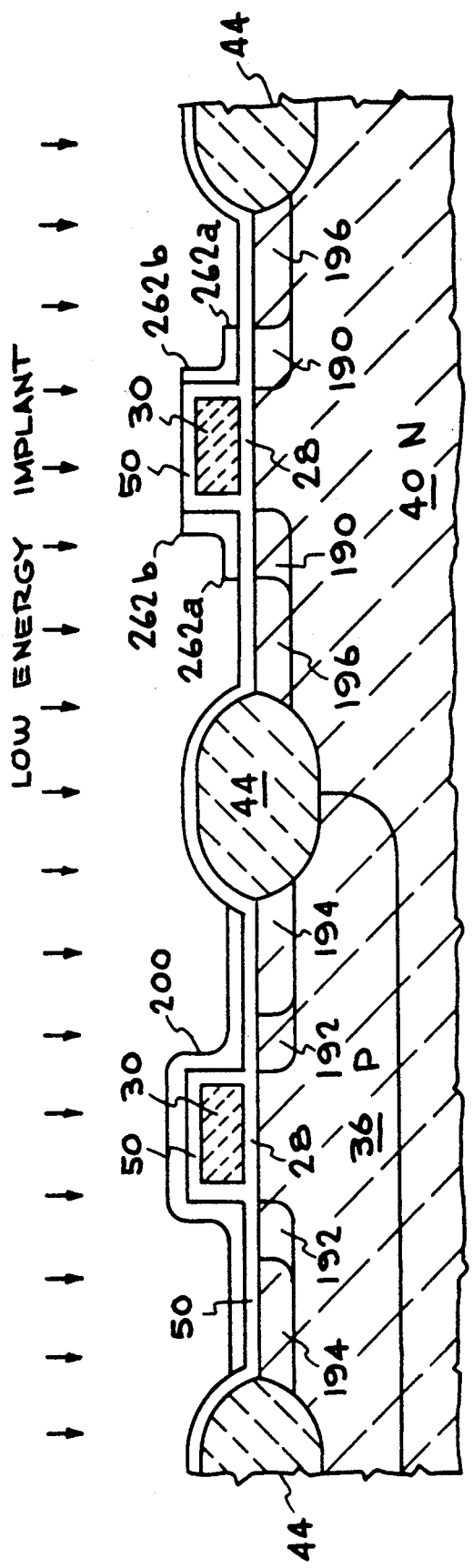
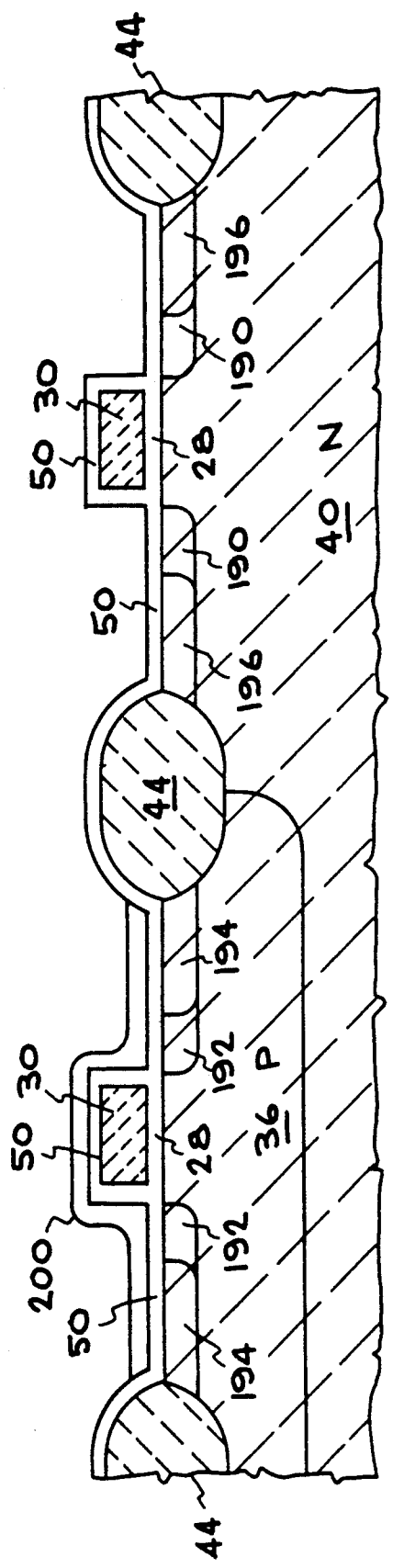

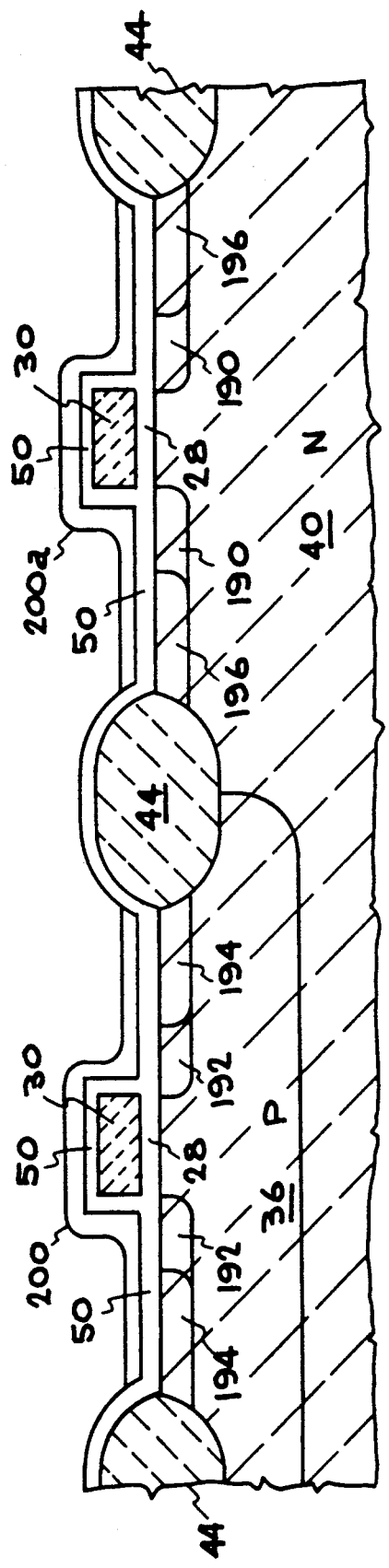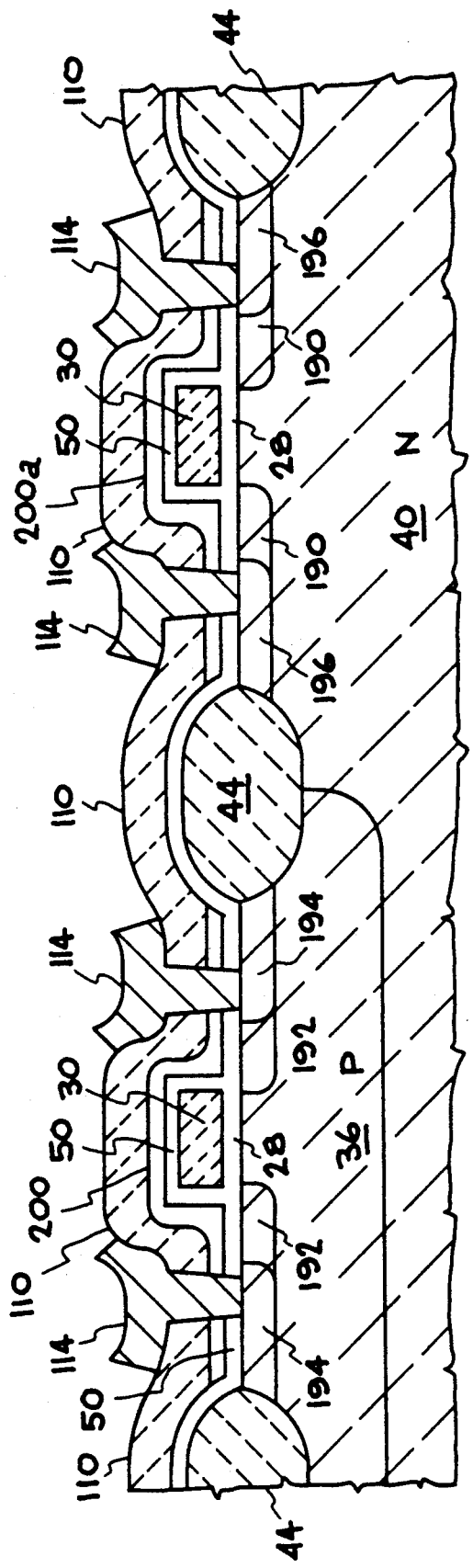

METHOD OF MAKING A HIGH PERFORMANCE MOS DEVICE HAVING BOTH P- AND N- LDD REGIONS USING SINGLE PHOTORESIST MASK

BACKGROUND OF THE INVENTION

1. Field of the Invention

This invention relates to MOS devices having LDD regions with graded junctions and methods of making same.

2. Description of the Related Art

In the continuing design of VLSI devices or chips with an ever increasing number of transistors and associated circuitry formed on the same amount of space, shrinkage or sizing down of each component has created further problems which must be dealt with in the construction of the VLSI chip. The shrinkage in size of MOS transistors results in a shorter channel length and this has created problems with respect to the electric field created near the drain region which can cause short channel effects or punchthrough in which the current begins to flow in uncontrolled form through the substrate beneath the channel.

To remedy this short channel or punch through effect, it has been proposed to grade the doping or impurities in the substrate by forming a lightly doped drain region (LDD) adjacent the channel with a more heavily and deeper doped drain region, in turn, formed adjacent the LDD region. The reduced or spread out fields of the lightly doped drain structure mitigates short-channel effects, reduce hot-carrier generation, and increase the junction breakdown voltage.

The problems of lower junction breakdown voltage and hot electron injection due to the sharp impurity profile of the drain junction and the proposed remedy of forming a lightly doped drain region were first discussed by Bassous et al in an article entitled "Self-Aligned Polysilicon Gate MOSFETs with Tailored Source and Drain Profiles" which appeared in IBM Technical Disclosure Bulletin Vol. 22, No. 11, in April 1980. Bassous et al proposed thermally oxidizing a polysilicon gate and the silicon substrate followed by reactive ion etching to form an oxide sidewall on the polysilicon gate following which source and drain regions in the substrate were implanted N+ using the oxide sidewall as a shield. The oxide sidewall was then stripped followed by an N− implant to form N− or lightly doped source and drain regions in the substrate between the N+ source and drain regions and the channel beneath the gate electrode.

FIGS. 1 and 2 illustrate how such lightly doped source and drain regions (LDD regions) are typically formed in this method. Oxide spacers 14 are formed on the side of a polysilicon strip 10 which forms the gate electrode, over gate oxide 16, for several MOS transistors formed in exposed portions of silicon substrate 20 under field oxide 18 as best seen in FIG. 1. Oxide spacers 14 are formed by depositing or growing a layer of oxide (silicon dioxide) over the structure including polysilicon strip 10 and then RIE etching the structure to remove the majority of the oxide leaving only the oxide spacers 14 due to their increased thickness in the step region of the oxide layer caused by the raised polysilicon strip.

The structure may then be N+ implanted to form the N+ source and drain regions 17 shown in FIG. 2 with oxide shoulders 14 shielding the substrate region immediately adjacent the channel region to be formed under gate electrode 10. Subsequently oxide shoulders 14 are removed, thereby permitting an N− implant in the previously shielded regions of the substrate shown outlined in dotted lines at 15.

Earlier, in an article entitled "A Quadruply Self-Aligned MOS (QSA MOS) A New Short Channel High Speed High Density MOSFET for VLSI" published at pp. 581-584 in IEDM in 1979, Ohta et al had proposed controlling or grading the depth of a single implant by forming a layer of oxide over a polysilicon gate electrode and then forming a nitride layer over the oxide layer which was patterned to extend laterally beyond the polysilicon gate and over a portion of the oxide layer over the substrate. The oxide layer was then reactive ion etched, using this nitride portion as a mask, resulting in horizontal portions of oxide remaining on the substrate extending laterally from the polysilicon gate electrode. A subsequent source and drain ion implant gave rise to deeper implanted regions further away from the gate electrode and more shallow implantation where the ions passed through the oxide layer resulting in shallow and deep implanted source and drain regions.

Subsequent to these publications, others have also published proposed methods of forming such lightly doped drain regions. Ogura et al, in "Design and Characteristics of the Lightly Doped Drain-Source (LDD) Insulated Gate Field-Effect Transistor", published in the IEEE Transactions on Electron Devices, Vol. ED-27, No. 8, in August of 1980, describe a method for forming such regions by first forming a column on a substrate comprising a polysilicon layer, a silicon nitride layer, and a silicon oxide layer. Using this column as a mask, the substrate is N+ implanted after which the polysilicon is overetched, undercutting the overlying nitride and oxide layers. The oxide and nitride layers are then removed and the substrate is then N− implanted to form N− regions in the substrate area beneath where the polysilicon was removed after the N+ implantation.

Tsang et al, in a paper entitled "Fabrication of High-Performance LDDFET's with Oxide Sidewall-Spacer Technology", published in the IEEE Transactions on Electron Devices, Vol. ED-29, No. 4, in April 1982, describe a method of forming LDD regions by first forming a polysilicon gate electrode, N− doping the substrate around the gate electrode, forming a silicon oxide layer over the structure which is then RIE etched to form oxide spacers on the sidewalls of the polysilicon gate electrode. Using these spacers as shields, the substrate is then N+ implanted. The original N− doping results in the formation of LDD regions between the channel under the gate electrode and the N+ regions source and drain subsequently implanted in the substrate.

Woo et al U.S. Pat. No. 4,728,617 discloses a method of fabricating a MOSFET with graded source and drain regions by growing a thermal oxide layer over a substrate on which has already been formed a gate electrode over gate oxide. A low temperature oxide is then deposited over the thermal oxide layer and the structure is then RIE etched to remove substantially all of the low temperature oxide except for spacers on the side of the raised thermal oxide layer adjacent the sides of the gate electrode. In one embodiment the structure is then implanted with a dopant which penetrates through the thermal oxide layer into the substrate except where the thermal oxide is shielded by the low temperature oxide spacers. The spacers are then removed, as well as the thermal oxide not previously shielded by the low temperature oxide, leaving only the thermal oxide portions previously below the spacers. The structure is then implanted a second time wherein the thermal oxide previously below the spacers acts to partially shield the substrate resulting in a shallow implant adjacent the channel portion below the gate electrode. In a second embodiment, the spacers are removed prior to any implantation and most of the thermal oxide layer not beneath the spacers is also removed, leaving only a thick thermal oxide, which may comprise either a single thickness or two thicknesses. The structure is then implanted with a dopant in a single implantation step wherein the remaining thermal oxide portions partially shield the substrate adjacent the channel region beneath the gate electrode resulting in a shallower implant beneath the thermal oxide portions.

Parillo et al, in an article entitled "A Versatile, High-Performance, Double-Level-Poly Double-Level-Metal, 1.2-Micron CMOS Technology", IDEM, 1986, pp. 244–247, describe constructing MOS devices using a disposable polysilicon spacer which is formed on the sidewall of the gate electrode following which an N+ implant to form source and drain regions is performed. The polysilicon spacers are then removed and an N− implant is made resulting in N− regions in the substrate adjacent to the gate electrode and separating the N+ regions from the channel formed in the substrate beneath the gate electrode.

Although many ways have thus been proposed to solve the short channel and punchthrough problem, including many ways of forming the lightly doped drain region, the use of oxide spacers has been the most widely used approach. However while the RIE etching of the oxide layer may use the underlying silicon 20 as an etch stop or end point for the etch, as shown in FIG. 2, in the field oxide region between adjacent MOS devices, there may be no silicon at the surface of the structure and the RIE etching will etch away grooves in the field oxide which, if not filled, can adversely affect the topography, and, if filled, can result in the formation of voids in the filler material which can subsequently result in reliability problems from inclusion of contaminants. Also if the voids are exposed, they may etch preferentially or oxidize which can, in turn, stress the substrate.

To avoid the problem of over etching into the field oxide between adjacent devices, it has been proposed, as discussed above, for example, with regard to the Parillo et al article, to replace the prior art oxide spacers or shoulders shown in FIGS. 1 and 2 with polysilicon spacers which would be formed by RIE etching a conformal polysilicon layer which would be formed over the structure (after first forming a thin oxide layer which would serve to separate the polysilicon gate strip from the conformal polysilicon layer). However, the use of a conductive material such as polysilicon to form the spacers adjacent the gate electrode necessitates the subsequent removal of such polysilicon spacers since they would be electrically floating and could cause threshold shifts.

Thus, there remained a need for solving the problem of short channel effects such as punchthrough in MOS transistors used in VLSI structures by constructing lightly doped drain regions without incurring the additional problems of the prior art which occurred when either oxide or polysilicon spacers were used in the course of the formation of such lightly doped source and drain regions.

European Patent Application 0,218,408 describes a process for forming LDD structures in integrated circuits. Three layers are formed over a gate electrode on a substrate. The bottom layer is an oxide layer; the middle layer is a nitride layer; and the top layer is a polysilicon layer. The polysilicon layer is then etched with an anisotropic dry etch to remove the polysilicon layer except for spacers left along the sides of the raised gate electrode. The substrate is then implanted with a heavy concentration of dopant, using the polysilicon spacers as a shield. After the first implantation, the polysilicon spacers are removed and the substrate is again implanted to form less heavily doped regions in the substrate in the areas previously shielded by the polysilicon spacers and adjoining the heavily doped regions of the substrate.

Komori et al Japanese Patent Document 60-241,267 describes a process to prevent damage to a substrate wherein a polysilicon sidewall is formed without completely etching a surface oxide film in a MOSFET of off-set structure. A gate oxide is first formed on a substrate followed by formation of a gate electrode over the gate oxide. A silicon oxide film is then formed over the entire structure and a nitride film is formed over the oxide layer. A polysilicon film is then formed which is RIE etched to form sidewalls or spacers on the side of the gate electrode (over the nitride and oxide layers). The nitride film acts an an etch stop during the etching of the polysilicon layer resulting in no removal of the underlying silicon oxide layer which, in turn, prevents damage to the substrate.

However, these teachings still utilize the spacers as the mask for shielding the structure when implanting to form the conventional source and drain regions in the substrate.

In copending U.S. patent application Ser. No. 127,995, filed Dec. 2, 1987, by Jacob Haskell and assigned to the assignee of this invention, entitled "METHOD OF MAKING A HIGH PERFORMANCE MOS DEVICE HAVING LDD REGIONS WITH GRADED JUNCTIONS", cross-reference to which is hereby made, there is described and claimed a method of making such LDD source and drain regions in MOS devices which comprises: forming over one or more gate electrodes on a substrate a shielding layer of an insulating material such as silicon nitride; forming another layer of a dissimilar material over the shielding layer such as an oxide or polysilicon layer; anisotropically etching the layer of dissimilar material over the shielding layer to remove the layer except for spacer portions over the shielding layer adjacent the sidewalls of the gate electrodes; removing the portions of the shielding layer not masked by the spacer portions, resulting in the formation of one or more el-shaped shielding members each having a vertical portion against the gate electrode and a horizontal leg extending over the substrate from the vertical portion; and then removing the spacer portions over the one or more el-shaped shielding members.

These el-shaped shielding members then serve as masks to permit the respective formation of conventional P+ or N+ doped source and drain regions in the substrate portion not masked by the el-shaped shielding members using a low energy, but high concentration, implantation which will not penetrate through the el-shaped shielding members. The substrate is also implanted with a low concentration of dopant material of the same type, but at an energy level sufficiently high to penetrate through the el-shaped shielding member to form lightly doped source/drain regions in the portions of the substrate beneath, i.e., shielded, by the el-shaped shielding members. This results in the formation of lightly doped source and drain regions, e.g., P— or N— LDD regions, in the substrate between the channel region of the substrate beneath the gate electrode and the conventional P+ or N+ source and drain regions formed in the substrate.

In one embodiment described therein, when one or more MOS devices of a first type are formed, the remaining portion of the substrate is masked with a first photoresist mask. Following formation of the MOS devices of the first type, the photoresist mask is removed and the MOS devices just formed are masked with a second photoresist mask while one or more MOS devices of a second (opposite) conductivity type are formed.

In a second embodiment described in the aforementioned Haskell patent application, after formation of the spacer members over the shielding layer, the first mask is applied, before removal of the portions of the underlying shielding layer not masked by the spacers. The portions of the shielding layer not covered by either the spacers or the photoresist mask are then removed followed by removal of the first photoresist mask. The remainder of the shielding layer, the el-shaped members, then act as a mask during formation of the MOS devices of the first type. However, while this second embodiment does eliminate the presence of the first photoresist mask during the implantation steps to form the MOS devices of the first type, the method still requires the use of two photoresist masks. Since each photoresist mask used may result in processing problems which negatively impact on the yield of chips from a wafer, it would be desirable from a standpoint of process economics, to completely eliminate the formation and use of one of the photoresist masks.

SUMMARY OF THE INVENTION

It is, therefore, an object of the invention to provide an improved method for forming CMOS integrated circuit structures comprising opposite conductivity type devices, each having lightly doped drain regions to avoid short channel and punchthrough problems, using a single separate mask. This is a marked improvement over alternative methods which sometimes required 2 masks, or often 3 or even 4 masks to accomplish formation of LDD P channel and LDD N channel transistors on one wafer.

It is another object of the invention to form such MOS devices with lightly doped drain regions by using a single separate mask, such as a photoresist mask, to form shielding members through which lightly doped regions (LDD regions) of a first conductivity type may be implanted in the substrate while shielding a high concentration implantation used to form highly concentrated doped regions of the same conductivity type adjacent the respective lightly doped regions; and, after forming one or more MOS devices of such first conductivity type, forming an oxide layer over the MOS devices which layer is capable of also functioning as a masking layer while forming further shielding members over other portions of the substrate, which shielding members are then used, together with the oxide layer, in the formation of one or more MOS devices of a second (opposite) conductivity type having lightly doped regions (LDD regions).

It is a further object of the invention to form NMOS and PMOS devices with lightly doped drain regions by forming a shielding layer through which a high energy, low concentration dopant of a second conductivity type is implanted into the substrate followed by application of a single separate mask, such as a photoresist mask over a portion of the substrate; forming first shielding members through which lightly doped regions (LDD regions) of a first conductivity type may be implanted in the unmasked portion of the substrate while shielding a high concentration implantation used to form highly concentrated doped regions of the same conductivity type adjacent the respective lightly doped regions resulting in the formation of one or more MOS devices of such first conductivity type; forming an oxide layer over the MOS devices which layer is capable of also functioning as a masking layer while forming further shielding members over other portions of the substrate, after removal of the separate masking layer, which shielding members are then used, together with the oxide layer, in the formation of one or more MOS devices of a second (opposite) conductivity type having lightly doped regions (LDD regions).

These and other objects of the invention will be apparent from the following description and accompanying drawings.

In accordance with the invention, an improved method for making an integrated circuit structure with both PMOS and NMOS devices, each having lightly doped drain regions to avoid short channel and punchthrough problems, using a single separate mask, comprises: forming a shielding layer of an insulating material over a plurality of gate electrodes on a substrate; doping the structure with a low concentration of a dopant of a first conductivity type and at an energy level sufficiently high to penetrate through the just formed shielding layer; forming another layer of a dissimilar material over the shielding layer; and anisotropically etching the layer of dissimilar material over the shielding layer to remove the layer except for spacer portions over the shielding layer adjacent the sidewalls of the gate electrodes.

A separate mask layer is then formed over a portion of the substrate, including one or more of the gate electrodes, and the portions of the shielding layer not masked by the spacer portions and the separate mask layer are removed, thereby forming one or more el-shaped shielding members each having a vertical portion against the one or more gate electrodes and a horizontal leg extending over the substrate from the vertical portion.

The spacer portions over these el-shaped shielding members are then removed and the substrate is implanted with a dopant material of a second conductivity type at a sufficiently low energy to prevent penetration of the dopant through the el-shaped shielding members and a concentration high enough to form highly doped source/drain regions of a second conductivity type in the portion of the substrate not shielded by the el-shaped shielding members, the gate electrodes, or the portions of the shielding layer and spacers which were beneath the separate mask layer.

The substrate is then implanted with a dopant material of the same type at a sufficiently high energy to penetrate through the el-shaped shielding member at a concentration low enough to form lightly doped source/drain regions of the second conductivity type in the portion of the substrate shielded by the el-shaped shielding member adjacent the channel regions of the substrate beneath the gate electrodes.

An oxide layer is now formed over the portion of the substrate not covered by the shielding layer and in which the MOS devices of the second conductivity type were formed. The separate mask is then removed, followed by removal of the remainder of the exposed shielding layer not masked by the spacers, and then the remaining spacers are removed to leave further el-shaped shielding members against the gate members in the unoxidized region of the substrate.

One or more MOS devices of the first conductivity type are then formed by implanting the substrate with a dopant material of the first conductivity type at a sufficiently low energy to prevent penetration of the dopant through the el-shaped shielding members and the oxide layer formed over the MOS devices of the second conductivity type, but at a concentration high enough to form highly doped source/drain regions of the first conductivity type in the portion of the substrate not shielded by the el-shaped shielding members, the gate electrodes, or the oxide layer formed over the previously formed MOS devices of the second conductivity type, whereby the low concentration implantations will form lightly doped source/drain regions separating the channel region of the substrate beneath the gate electrodes of the respective MOS devices from the highly doped source/drain regions of the respective devices while using only a single separate masking layer.

BRIEF DESCRIPTION OF THE DRAWINGS

FIGS. 3-14 are fragmentary side section views of the sequential construction of LDD regions of NMOS and PMOS devices in accordance with the method of the invention.

DETAILED DESCRIPTION OF THE INVENTION

The invention provides an improvement in the method of making MOS devices of opposite conductivity types each having LDD regions formed between the channel region and the source/drain regions of the respective devices, by utilizing a single separate mask to form the devices of both conductivity types. Practice of the process of this invention, for example, can result in the elimination of one photoresist mask from the process disclosed and claimed in the previously referenced copending Haskell U.S. patent application Ser. No. 127,995.

By the term "separate mask" is meant a mask, such as a photoresist mask, which covers an entire section of the substrate in which MOS devices will be formed, in contrast to the el-shaped shielding members, and which serves no other purpose, in contrast to the oxide layer formed over the MOS devices of one conductivity type initially formed in the integrated circuit structure.

Figure 1:
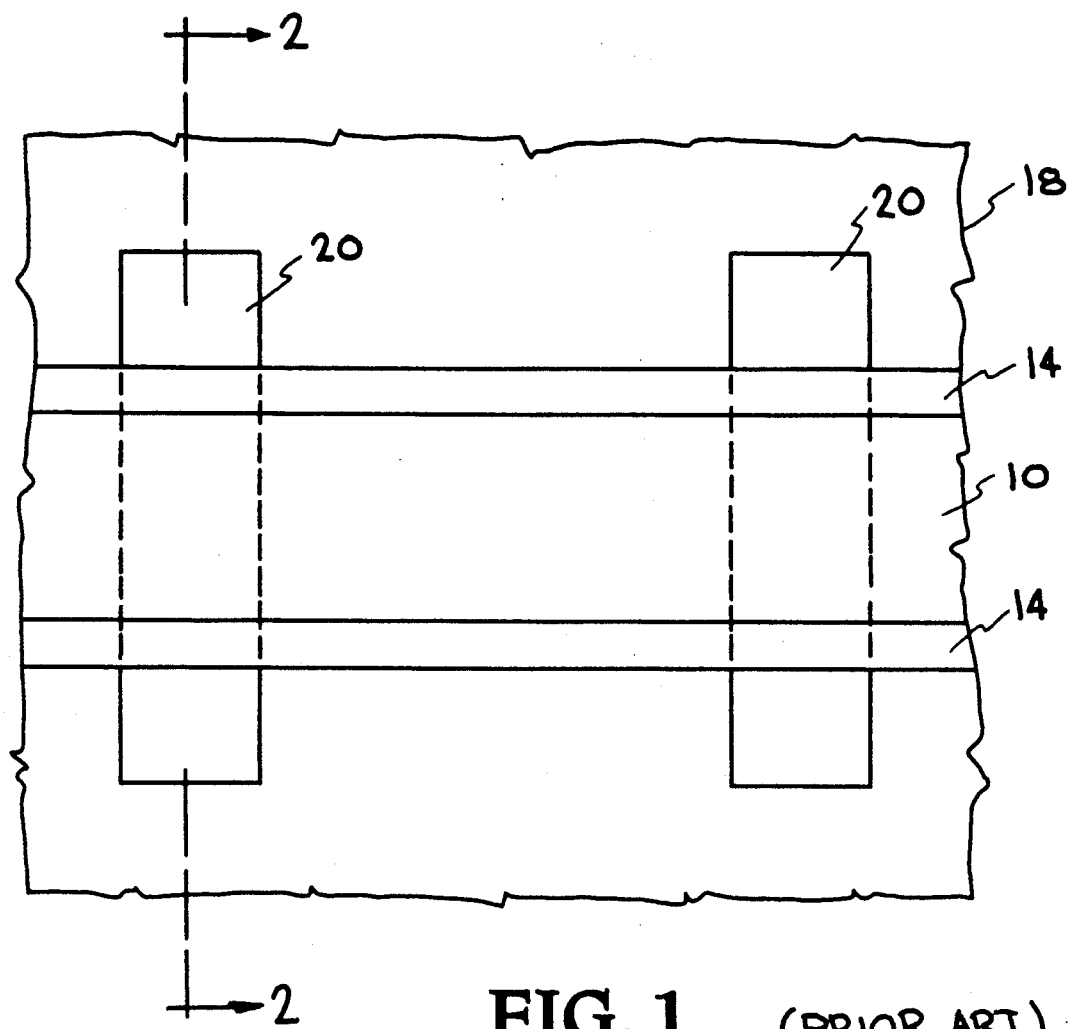
FIG. 1 is a fragmentary top view of a portion of a prior art MOS device.
Figure 2:
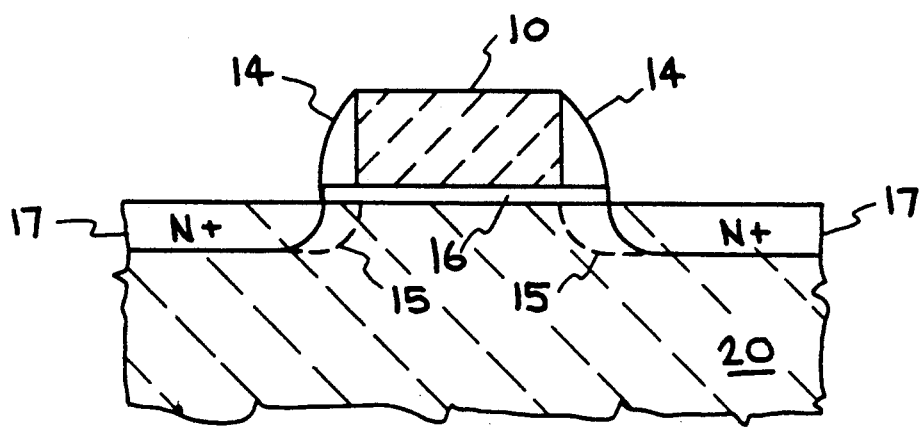
FIG. 2 is a fragmentary side section view of a portion of FIG. 1 (Prior Art).
Figure 3:
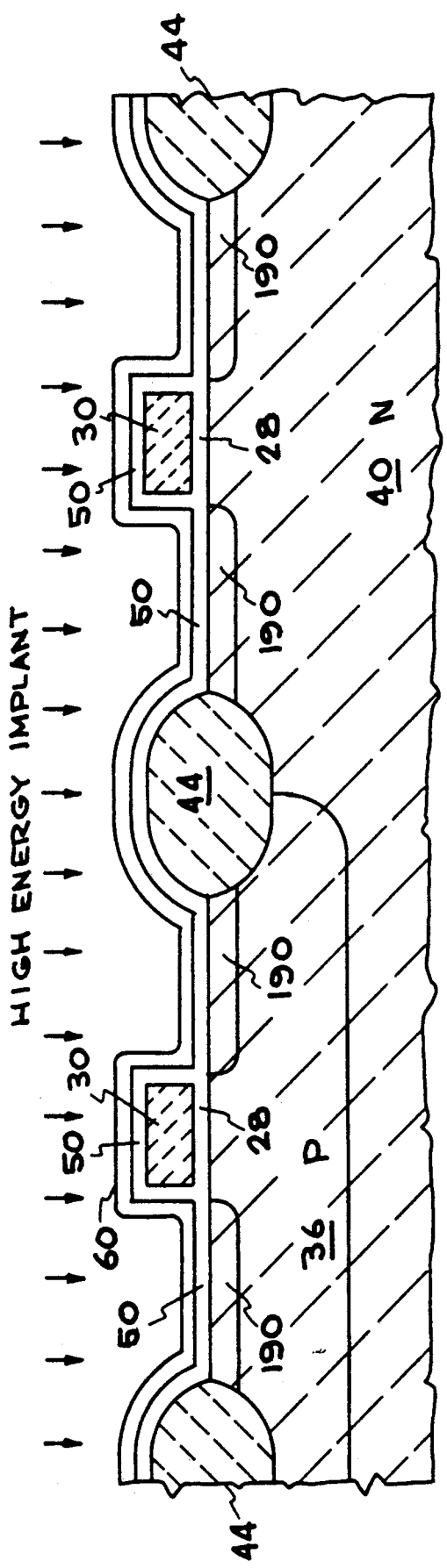

Referring now to FIGS. 3-13, the process will be described by way of illustration and not of limitation. In FIG. 3, polysilicon gate electrodes 30 are shown conventionally formed over a gate oxide layer 28 by previous deposition and etching of a polysilicon layer using gate oxide layer 28 as an etch stop. Prior to formation of gate electrodes 30, a P well 36 may be formed in N doped silicon substrate 40 as well as field oxide portions 44 to electrically separate or isolate the device from adjoining devices. It will be understood, of course, that conversely an N well could be formed in a P doped substrate or both N wells and P wells utilized in an N— or P— doped substrate, or dielectrically isolated substrate, and that other forms of isolation, e.g., slots, could be used to isolate adjacent devices from one another.

An oxide layer 50 is formed over the polysilicon gates 30 and the gate oxide 28 on silicon 40, including P well 36. Oxide layer 50 is formed, e.g., grown, to a thickness of about 350–450 Å, preferably about 400 Å, on polysilicon gate electrode 30 and a thickness of about 200–300 Å, preferably about 250 Å, over the silicon substrate.

A high energy, low concentration implant of a first conductivity type, e.g., a P— implant, may be carried out using, for example, $B_{11}$ at an energy level of at least about 50 Kev and a concentration of about $10^{13}$ ions/cm$^2$. The high energy implant penetrates through oxide layer 50 into substrate 40 to form the P type lightly doped source and drain regions 190 as shown in FIG. 3. This implant forms the P-channel LDD implant. It also penetrates the N-channel regions, but will be compensated by the later N-channel implant dose.

A layer of material of about 800 to 1000 Å is then deposited over oxide layer 50 to form shielding layer 60. The material comprising shielding layer 60 may comprise any material which may be selectively removed, i.e., selectively etched away, without damage to the substrate, the polysilicon gate electrode, or to the spacers which will subsequently be formed from a conformal layer 70 deposited over layer 60 as will be described below. By way of example, and not of limitation, shielding layer 60, and the el-shaped shielding members which will be formed therefrom, will be described as a silicon nitride layer having a thickness which may vary from at least about 400 to about 800 Å. Alternatively, the high energy implant, which forms regions 190, may be done after forming shielding layer 60 (shown in FIG. 4) over the structure.

Figure 4:
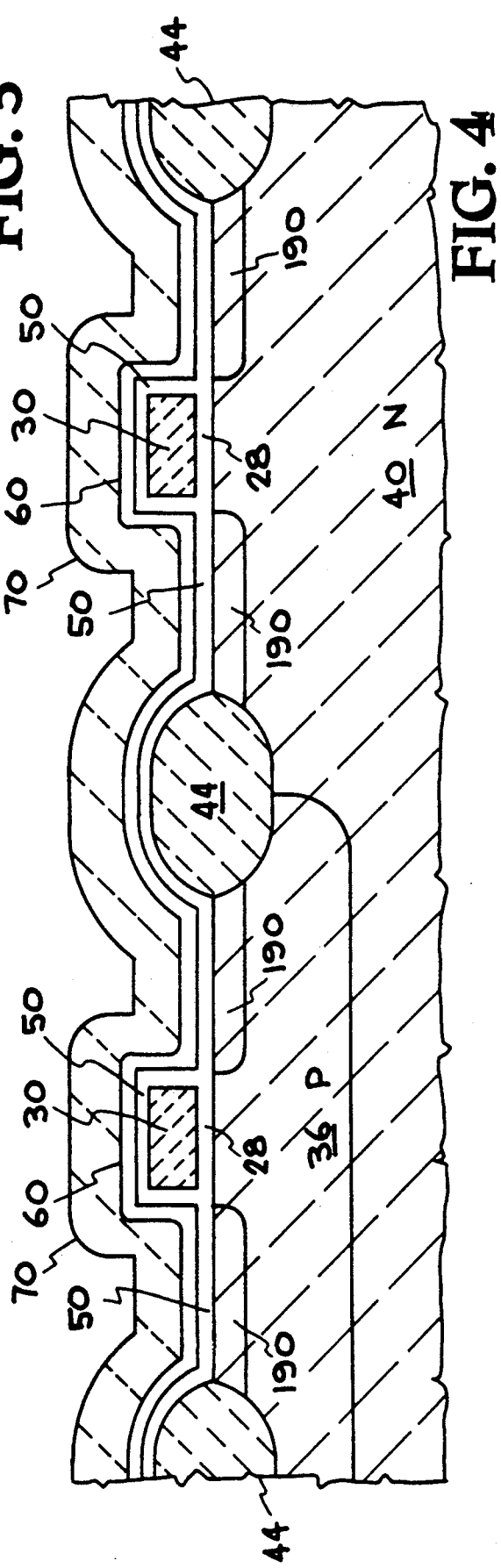
Figure 5:
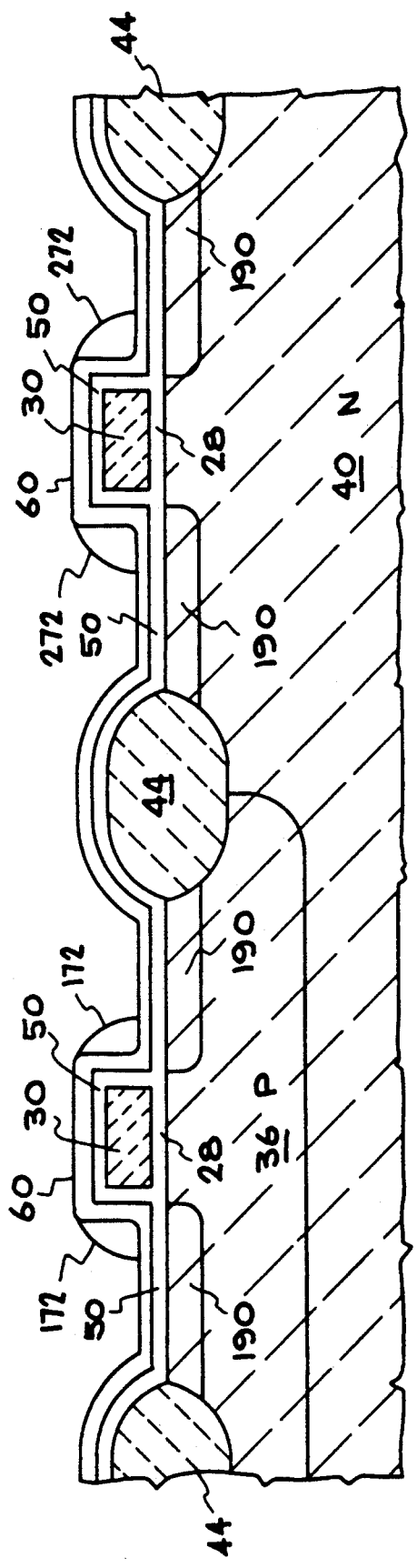

After this initial implantation, conformal layer 70 is applied over shielding layer 60 as shown in FIG. 4. Conformal layer 70 may comprise a 2200 to 2800 Å, preferably about 2500 Å, thick layer of polysilicon. Other materials may also be used to form conformal layer 70. After formation over shielding layer 60, conformal layer 70 is etched with a RIE type anisotropic etch to remove most of the conformal polysilicon layer leaving only polysilicon spacers 172 and 272 as shown in FIG. 5. Polysilicon conformal layer 70 may be etched with a chlorinated RIE etchant system, e.g., CCl$_4$ or SiCl$_4$ may be used, using the underlying nitride layer 60 as an etch stop.

Figure 6:
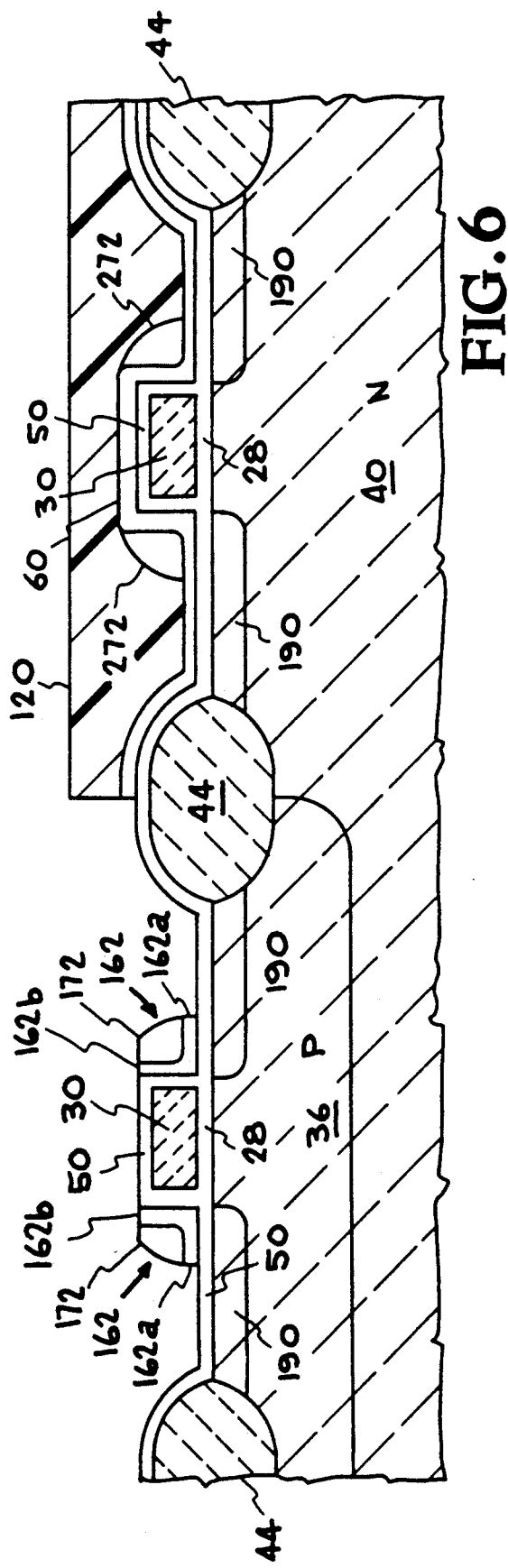

As shown in FIG. 6, a separate mask layer, such as a photoresist mask 120, is then applied over shielding layer 60 leaving exposed only that part of layer 60, and polysilicon spacers 172 thereon, which lie over the portion of the substrate in which one or more MOS devices of a conductivity type opposite to the initial implantation will be constructed, hereinafter referred to as a second conductivity type.

The remaining exposed portion of shielding layer 60 may then be etched with a selective etchant which will not etch polysilicon spacers 172, such as, for example, phosphoric acid, when shielding layer 60 comprises silicon nitride.

This results in the formation of el-shaped shielding members 162 beneath spacers 172, each comprising a horizontal portion or leg 162a extending from gate electrode 30 over a portion of the substrate and oxide layers 50 and 28 thereon and a vertical portion 162b formed on the portion of oxide layer 50 on the sidewall of gate electrode 30 as seen in FIG. 6.

Polysilicon spacers 172 may then be removed after the selective etching of nitride layer 60 to form el-shaped nitride shielding members 162 since the sole purpose of spacers 172 is to provide an etch mask or pattern to control the width of the horizontal leg 162a of el-shaped nitride shielding member 162. Polysilicon spacers 172 may be removed, as shown in FIG. 7, using a selective wet etchant such as KOH which is not an etchant for the underlying el-shaped nitride shielding member 162 nor the adjoining oxide layer 50 overlying gate electrodes 30 or exposed by removal of the remainder of nitride layer 60.

Still referring to FIG. 7, a high energy, low concentration N− implant is now carried out using, for example, a phosphorus implantation at 150 Kev and a concentration of about $10^{13}$ to $10^{14}$ ions/cm². The high energy implant penetrates through the horizontal nitride shoulder 162a and the underlying oxide layer 50 into substrate 40 to form the lightly doped source/drain regions 192 shown in FIG. 7.

It should be noted that while the concentration of the N− phosphorus dopant is kept low to provide the desired light doping of the regions 192 below el-shaped shielding members 162, it must be sufficiently high to overcome the initial high energy P− doping of the substrate below shielding layer 60.

This high energy N− implantation is then followed by a low energy, high concentration N+ implantation step to form the conventional highly doped source and drain contact regions 194 in the substrate using, for example, an arsenic implantation at an energy level of about 60 Kev with a concentration of from about $10^{15}$ to about $10^{16}$ ions/cm². The horizontal portions 162a of the el-shaped nitride shielding members 162 shield the previously formed lightly doped regions 192 thereunder from the low energy N+ implantation. The result is the formation of one or more NMOS devices with N+ source and drain contact regions 194, as shown in FIG. 8, separated from the N channel of the NMOS device beneath gate 30 by lightly doped (LDD) N− regions 192.

It should be noted here that the sequence of the two N dopant implantation steps is not important and the low energy N+ implantation step may be performed first. What is important is that the portion of the substrate where the lightly doped N− source and drain regions have been formed (or will be formed) in substrate 40 beneath portions 162a of el-shaped nitride shielding members 162 must be shielded from the N+ implantation so that these substrate regions under nitride horizontal portion 162a will only be lightly doped.

Following formation of the NMOS devices, el-shaped shielding members 162, and any other portions of shielding layer 60 not covered by photoresist mask 120, are selectively removed using a dry etch such as, for example, a RIE etch, or a selective wet etch, such as, for example, phosphoric acid.

Figure 9:
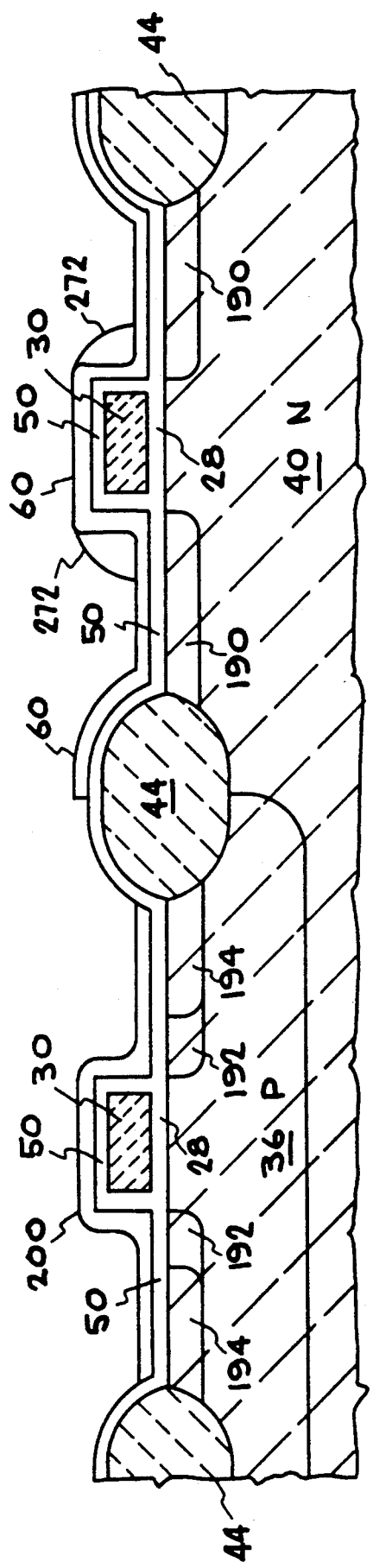

The photoresist mask 120 is then removed and a thermal oxide layer 200 of about 300 to about 500 Å thickness, preferably about 400 Å thickness, is grown over the newly formed NMOS structures with the remaining portions of shielding layer 60 preventing oxide growth in those portions of the substrate thereunder, as seen in FIG. 9. The thickness of oxide layer 200 may vary somewhat, but it must be thick enough to prevent penetration of the P+ low energy implantation which will subsequently be made to complete formation of the PMOS devices.

Figure 10:
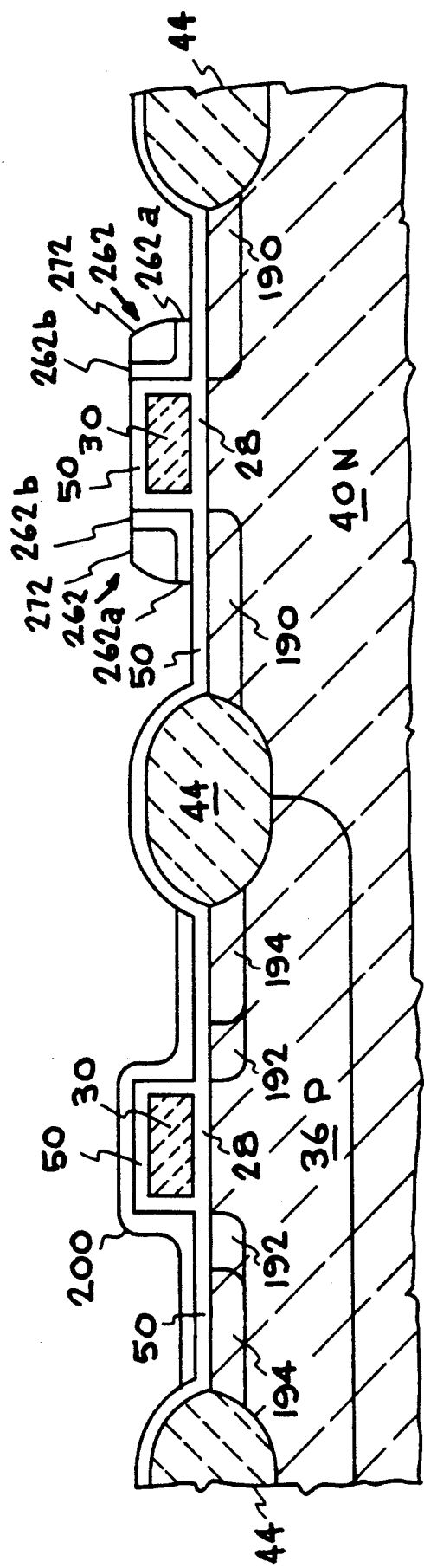

Referring now to FIG. 10, the portions of shielding layer 60 exposed by the removal of photoresist layer 120 and not masked by polysilicon spacers 272 are now selectively removed using, for example, phosphoric acid which will not remove either polysilicon spacers 272 or oxide layer 200, resulting in the formation of el-shaped spacer members 262 which, similarly to spacer members 162, each comprising a horizontal component 262a and a vertical component 262b.

Polysilicon spacers 272 may then be removed, as shown in FIG. 11, using a selective wet etchant such as KOH which is not an etchant for the underlying el-shaped nitride shielding members 262 nor the adjoining oxide layer 200 over the NMOS devices.

Following this, a low energy, high concentration P+ implant is made using, for example, BF₂, at 80–100 Kev at a concentration of from about $10^{15}$ to about $10^{16}$ ions/cm². This results in a shallower implantation of dopant (compared to the initial P− implantation) through the oxide layer 50 into the substrate to form heavily doped (P+) source and drain contact regions shown at 196 in FIG. 11 due to the concentration of the dopant. However, the low energy of the P+ doping step results in the P+ implantation not penetrating through the sandwich layer of horizontal legs 262a of el-shaped nitride shielding members 262 and oxide 50 resulting in a masking of the initially formed lightly doped source and drain (LDD) P− regions 190 formed during the initial high energy P− implantation step.

Following formation of the PMOS devices, the remaining el-shaped nitride members 262 may be stripped from the structure using, for example, a phosphoric acid wet etch. As an option, implant-damaged portions of oxide layer 200 may also be removed at this point, if desired using etching techniques which will not result in etching of the silicon substrate.

The resultant structure may now be annealed by heating to a temperature of from about 900° to 1000° C. for a period of from about 15 to about 30 minutes. The structure may also be annealed using a rapid thermal annealing process wherein the structure is heated to from about 1000° to about 1100° C. for from about 10 to about 30 seconds.

About 200 Å of oxide may now be grown over the newly formed PMOS regions, as shown at 200a in FIG. 13, to protect the substrate and to prevent counter doping of the substrate by reflowing of doped glass which may be subsequently applied in later process steps.

Alternatively, the annealing step and the formation of oxide layer 200a may be consolidated into a single step with the heat used during the deposit or growth of this oxide layer also serving to anneal the implanted substrate regions.

It should also be noted that, if desired, an anneal may be conducted after the implantations to form the NMOS devices and prior to the processing of the second channel. This might, for example, be desirable if a dopant which diffuses slower, such as arsenic, is implanted to form the NMOS devices first, followed by an anneal and then P+ implantation of the PMOS devices using a dopant such as boron which diffuses faster. Subsequent annealing would then expose the arsenic to a longer total diffusion time than the boron.

After completion of the formation of the NMOS and PMOS devices, a conventional insulating layer of oxide or doped glass may be applied over the structure and patterned to form oxide portions 110 with a metal layer then applied and patterned to form metal source and drain contacts 114 to the respective N+ and P+ source and drain contact regions resulting in the LDD MOS structure shown in FIG. 14.

The term "high energy" as used herein is intended to define an energy level sufficiently high to penetrate the thickness of either shielding layer 60 or the horizontal legs 162a or 262a of the respective el-shaped nitride shielding members 162 and 262, as well as underlying oxide layer 50, and to implant the dopant a minimum distance of at least about 500 Å into the substrate thereunder. The absolute values will, however, depend upon the mass of the particular dopant used, the sheet resistance of the N−/P−, and the working voltage of the structure discussed.

The term "low energy", as used herein is intended to define an implantation at an energy level insufficient to penetrate through the thickness of the aforesaid horizontal leg of el-shaped nitride shielding members 162 or 262, but sufficient to penetrate into said substrate a minimum distance of at least about 600 Å in those regions not shielded by said el-shaped shielding member or other masking members.

The term "high concentration" as used herein is intended to define a doping concentration of at least $10^{15}$ ions/cm$^3$, while the term "low concentration" as used herein is intended to define a doping concentration of at least $10^{13}$ ions/cm$^3$, but no more than $5 \times 10^{14}$ ions/cm$^3$.

Attention should again be called to the fact that the respective formation of the el-shaped nitride shielding members 162 and 262 results in the respective formation of vertical portions 162b and 262b as well as the horizontal portions 162a and 262a of the respective members. While the horizontal portions 162a and 262a serve to shield the substrate from the respective low energy P+ and N+ implantations, resulting in only the low concentration, high energy implantations penetrating to the substrate thereunder, the vertical portion of each el-shaped member 162 or 262 also serves a useful function by shielding the substrate thereunder during both the high energy and low energy implantations. The result is the formation of respective regions between the implanted P− or N− LDD regions and the channel region under gate electrode 30 and gate oxide 28 in which there is little, if any, dopant present.

As a result of this, the naturally occurring lateral diffusion of dopant during the subsequent annealing step or steps does not result in any appreciable migration of dopant into the N or P channel regions under the gate electrodes 30.

This, in turn, results in a reduction in the Miller capacitance of the device, resulting in a higher performance device, e.g., raises the speed of the device.

In this regard, it should also be pointed out that the thickness of the initial nitride layer 60, from which el-shaped nitride shield members 162 and 262 are formed, will control the width of the vertical portions 162b and 262b of the respective shield members 162 and 262 while the annealing conditions will control the amount of lateral migration of the dopant into this shielded region of the substrate. Therefore, these two parameters may be coordinated to maximize the desired reduction of Miller capacitance formed between the substrate and gate electrode 30.

It should also be noted that the two implantation steps used in forming each channel result in a vertical gradiation in the concentration of the dopant in the contact regions of the source and drain regions resulting in a reduction in the junction to substrate capacitance of the device as well which further enhances its performance.

Using the process and el-shaped shielding members of the invention, permits greater flexibility with respect to the choice of thickness for the oxide layer 50 which is initially formed over the gate oxide and polysilicon gate electrode. In conventional processing, the thickness of the oxide layer 50 over the source and drain regions is limited by the implant energy of the P+/N+ implantations.

That is, while it might be desirable to make oxide layer thick to protect the gate edges during subsequent etch steps, this will inhibit penetration of the P+/N+ implantations. Even in the process of the invention, etching of the layer 60 to form the el-shaped shielding members can result in some etching of oxide layer 50, resulting in nonuniformity.

However, when using the el-shaped shielding members, it is possible to form an initial thick oxide layer 50 having a thickness of about 350 to 400 Angstroms and then, after the el-shaped shielding members have been formed, to remove the remaining exposed portions of oxide layer 50. A new oxide layer can then be grown or deposited over the source and drain regions as well as over the polysilicon gate electrode after the source and drain implantations. In this manner, a thick oxide layer may be formed beneath the el-shaped shielding members to cooperate with the el-shaped shielding members in protecting the gate edges without interfering with the low energy, high concentration P+/N+ implantations.

Thus, the invention provides an improved method of forming LDD regions in MOS devices which permit the use of such devices in VSLI structures while eliminating the problems of short channel and punchthrough voltage. The process further solves these problems without creating further processing problems as experienced in the prior art use of polysilicon or oxide spacers to shield the substrate from the N+ and P+ implantations to form the desired lightly doped source and drain regions. The use of only one separate mask eliminates at least one process step as well as reducing the amount of process defects which can be introduced with the use of each mask.

Having thus described the invention, what is claimed is:

1. An improved method for making an integrated circuit structure containing both PMOS and NMOS devices having lightly doped drain regions to avoid short channel and punch-through problems characterized by the use of a single photo-resist mask in the method which comprises:
    (a) forming lightly doped source and drain (LDD) regions of a first conductivity type in a substrate adjacent to previously formed raised gate electrodes in a first implantation step;
    (b) forming a shielding layer over said structure after said first implantation step;
    (c) forming spacers of a different material than said shielding material over said shielding layer adjacent the sidewalls of said raised gate electrodes;

(d) forming said single photoresist mask over a portion of said structure containing one or more of said gate electrodes and LDD regions of a first conductivity type;

(e) selectively removing portions of said shielding layer not masked by said spacers or said photoresist mask;

(f) implanting portions of said substrate not covered by said photoresist mask or remaining portions of said shielding layer with a dopant of a second conductivity type to form source and drain regions for MOS devices of said second conductivity type;

(g) removing said spacers not covered by said photoresist mask, leaving el-shaped portions of said shielding layer comprising el-shaped shielding members having vertical portions adjacent the sides of said raised gate electrodes and horizontal portion extending over said substrate from said vertical portions a distance which approximates the width of said spacers to define LDD regions to be formed in said substrate;

(h) then forming lightly doped source and drain (LDD) regions of said second conductivity type adjacent gate electrodes not shielded by said photoresist mask by implanting said structure with a second conductivity type dopant at an energy level sufficient to penetrate said horizontal portions of said el-shaped shielding members;

(i) removing said el-shaped shielding members;

(j) growing a layer of oxide over the newly formed MOS devices of said second conductivity type to shield said second conductivity type MOS devices during subsequent formation of MOS devices of said first conductivity type;

(k) removing said single photoresist mask layer;

(l) selectively removing remaining portion of said shielding layer not under said remaining spacers leaving el-shaped portions of said shielding layer comprising el-shaped shielding members having vertical portions adjacent the sides of said raised gate electrodes and horizontal portion extending over said substrate from said vertical portions a distance approximately equal to the width of said spacers over said previously formed LDD regions of said first conductivity type in said substrate; and (m) forming source and drain regions of said first conductivity type in the portion of said substrate not covered by said oxide layer adjacent said previously formed LDD regions of a first conductivity type, using said el-shaped shielding members as a mask;

whereby lightly doped source/drain (LDD) regions may be formed in an integrated circuit structure for both NMOS and PMOS devices using a single photoresist mask to provide lightly doped source/drain regions separating the channel regions of the substrate beneath said respective gate electrodes from said highly doped source/drain regions of said MOS devices.

2. The method of claim 1 wherein said step of forming said shielding layer is carried out prior to said step of forming said LDD regions of a first conductivity type, and said LDD regions of a first conductivity type are formed by a first implantation at an energy level sufficient to penetrate said shielding layer.

3. The method of claim 2 wherein said first implantation is carried out at a dopant concentration sufficiently low to form said LDD regions of said first conductivity type.

4. The method of claim 1 wherein said implantation carried out after removal of said spacers to form said LDD regions of said second conductivity type is carried out at a dopant concentration sufficiently low to form said LDD regions of said second conductivity type.

5. The method of claim 1 wherein said source and drain regions of said second conductivity type are formed by an implantation at an energy level insufficient to penetrate said shielding portions.

6. The method of claim 5 wherein said implantation to form said source and drain of regions of said second conductivity type is carried out at a dopant concentration sufficiently high to form said source and drain regions of said second conductivity type.

7. The method of claim 1 wherein said source and drain regions of said first conductivity type are formed by an implantation at an energy level insufficient to penetrate either the el-shaped shielding members over said previously formed LDD regions of said first conductivity type or the oxide layer formed over said MOS devices of said second conductivity type.

8. The method of claim 7 wherein said fourth implantation is carried out at a dopant concentration sufficiently high to form said source and drain regions of said first conductivity type.

9. The method of claim 1 wherein said step of implanting said substrate to form said source and drain regions of said second conductivity type is carried out after steps g and h and the energy level of said implantation is sufficient to penetrate said horizontal portions of said el-shaped shielding members over said already formed LDD regions of said second conductivity type.

10. The method of claim 1 wherein said step of implanting said substrate to form said source and drain regions of said second conductivity type is carried out before steps g and h.

11. The process of claim 1 including the further step of forming an oxide layer over said substrate prior to said step of forming said shielding layer.

12. The process of claim 11 wherein said step of forming said shielding layer further comprises forming a silicon nitride layer over said oxide layer.

13. The process of claim 12 wherein said step of forming spacers over said shielding layer of a different material than said shielding layer further comprises forming polysilicon spacers over said silicon nitride shielding layer.

14. A method for making an integrated circuit structure containing both PMOS and NMOS devices having lightly doped drain regions to avoid short channel and punchthrough problems which comprises:

(a) forming a plurality of gate electrodes on a substrate;

(b) forming a shielding layer of an insulating material over said gate electrodes and substrate;

(c) implanting the structure with a high energy, low concentration dopant of a first conductivity type;

(d) forming another layer of a dissimilar material over said shielding layer;

(e) anisotropically etching said layer of dissimilar material over said shielding layer to remove said layer except for spacer portions over said shielding layer adjacent the sidewalls of said gate electrode;

(f) forming a separate mask over a portion of said structure containing one or more of said gate electrodes;

(g) removing the portions of said shielding layer not masked by said separate mask or said spacer portions, leaving one or more el-shaped shielding members each having a vertical portion against said gate electrode and a horizontal leg beneath said spacer portion extending over said substrate from said vertical portion;

(h) removing said spacer portions over said el-shaped shielding members;

(i) implanting said substrate with a dopant material of a second conductivity type at a sufficiently low energy to prevent penetration of said dopant through said el-shaped shielding members and a concentration high enough to form a highly doped source/drain region in the portion of the substrate not shielded by said el-shaped shielding members or said gate electrode;

(j) implanting said substrate with a dopant material of said second conductivity type at a sufficiently high energy to penetrate through said el-shaped shielding members at a concentration low enough to form lightly doped source/drain regions in the portion of the substrate shielded by said el-shaped shielding member adjacent the region of said substrate beneath said gate electrode;

(k) removing said el-shaped members;

(l) growing a layer of oxide over the newly formed MOS devices of said second conductivity type;

(m) removing said separate mask layer;

(n) selectively removing the remaining portions of said shielding layer not covered by said spacer members to form further el-shaped shielding members;

(o) removing said spacer portions over said further el-shaped shielding members;

(p) implanting said substrate with a dopant material of said first conductivity type at a sufficiently low energy to prevent penetration of said dopant through said el-shaped shielding members and a concentration high enough to form highly doped source/drain regions of said first conductivity type in the portions of the substrate not shielded by said el-shaped shielding members, said gate electrode, or said thermal oxide over said MOS devices of said second conductivity type to thereby form one or more MOS devices of said first conductivity type;

whereby said low concentration implantations will form lightly doped source/drain regions separating the channel regions of the substrate beneath said respective gate electrodes from said highly doped source/drain regions of said MOS devices.

15. The method of claim 14 wherein said step of forming a shielding layer over said gate electrode and said substrate further comprises first forming an oxide layer over said gate electrode and substrate and then forming a shielding layer over said oxide layer.

16. The method of claim 14 wherein said step of forming said shielding layer further comprises forming a layer of nitride over a layer of oxide formed over said substrate and said gate electrode.

17. The method of claim 16 wherein said step of forming said layer of dissimilar material over said nitride shielding layer further comprises forming a polysilicon layer over said nitride shielding layer.

18. The method of claim 14 wherein said step of forming a separate mask over a portion of said substrate comprises forming a photoresist mask over a portion of said substrate.

19. A method for making an integrated circuit structure containing both PMOS and NMOS devices having lightly doped drain regions to avoid short channel and punchthrough problems using a single photoresist mask which comprises:

(a) forming a plurality of polysilicon gate electrodes over a gate oxide layer on a silicon substrate;

(b) forming a first oxide layer over said gate electrodes and said gate oxide;

(c) forming a shielding layer comprising a silicon nitride insulating material over said first oxide layer on said gate electrodes and said substrate;

(d) implanting the structure with a high energy, low concentration dopant of a first conductivity type;

(e) forming a layer of polysilicon over said silicon nitride shielding layer;

(f) anisotropically etching said polysilicon layer over said silicon nitride shielding layer to remove said layer except for spacer portions over said shielding layer adjacent the sidewalls of said gate electrode;

(g) forming a separate photoresist mask over a portion of said integrated circuit structure containing one or more of said gate electrodes;

(h) removing the portions of said silicon nitride shielding layer not masked by said separate photoresist mask or said polysilicon spacer portions, to form one or more el-shaped shielding members, each having a vertical portion against said gate electrode and a horizontal leg beneath said spacer portion extending over said substrate from said vertical portion;

(i) removing said polysilicon spacer portions over said el-shaped shielding members;

(j) implanting said substrate with a dopant material of a second conductivity type at a sufficiently low energy to prevent penetration of said dopant through said el-shaped shielding members and a concentration high enough to form highly doped source/drain regions in the unmasked portion of the substrate not shielded by said el-shaped shielding members or said gate electrodes;

(k) implanting said substrate with a dopant material of said second conductivity type at a sufficiently high energy to penetrate through said el-shaped shielding members at a concentration low enough to form lightly doped source/drain regions in the unmasked portion of the substrate shielded by said el-shaped shielding member adjacent the region of said substrate beneath said gate electrode;

(l) removing said el-shaped members;

(m) growing a layer of oxide over the newly formed MOS devices of said second conductivity type;

(n) removing said separate photoresist mask layer;

(o) selectively removing the remaining portions of said silicon nitride shielding layer not covered by said polysilicon spacer members to form further el-shaped shielding members;

(p) removing said polysilicon spacer portions over said further el-shaped silicon nitride shielding members;

(q) implanting said substrate with a dopant material of said first conductivity type at a sufficiently low energy to prevent penetration of said dopant through said el-shaped shielding members and a concentration high enough to form highly doped source/drain regions of said first conductivity type in the portions of the substrate not shielded by said el-shaped shielding members, said gate electrode, or said thermal oxide over said MOS devices of said second conductivity type to thereby form one or more MOS devices of said first conductivity type;

whereby said method using a single photoresist mask and low concentration implantations will form lightly doped source/drain regions separating the channel regions of the substrate beneath said respective gate electrodes from said highly doped source/drain regions of said MOS devices.

* * * * *